United States Patent [19]

Lewis

[11] Patent Number: 4,896,777
[45] Date of Patent: Jan. 30, 1990

[54] LOCK AND SHOCK MOUNTED DEVICE FOR COMPUTER DISK DRIVE

[75] Inventor: Jeffrey M. Lewis, Maynard, Mass.

[73] Assignee: Digital Equipment Corporation, Maynard, Mass.

[21] Appl. No.: 178,295

[22] Filed: Apr. 6, 1988

[51] Int. Cl.$^4$ .............................................. A47F 5/00
[52] U.S. Cl. ...................................... 211/41; 211/26; 361/399; 361/415
[58] Field of Search .......................... 211/41, 26, 89, 4; 361/386, 415, 395, 399, 412

[56] References Cited

U.S. PATENT DOCUMENTS

| | | | |
|---|---|---|---|
| 3,845,359 | 10/1974 | Fedele | 361/415 X |
| 3,853,379 | 12/1974 | Goodman et al. | 361/415 X |
| 4,354,770 | 10/1982 | Block | 361/415 X |
| 4,547,835 | 10/1985 | Pansaerts et al. | 361/415 X |
| 4,550,836 | 11/1985 | Ellis | 211/41 |
| 4,648,009 | 3/1987 | Beun et al. | 211/41 X |
| 4,702,535 | 10/1987 | Beun | 211/41 X |
| 4,716,497 | 12/1987 | Craker | 361/399 X |

Primary Examiner—Robert W. Gibson, Jr.
Attorney, Agent, or Firm—Hayes, Soloway, Hennessey & Hage

[57] ABSTRACT

A mounting system for mounting a disk drive mechanism in a computer circuit board card cage is described. The mounting system includes a support for the disk drive and a locking assembly associated with the support and movable towards the disk drive to lock the disk drive against movement with respect to the support. The mounting system also includes a cam and a locking and control assembly for selectively holding the cam in a first operative position and a second inoperative position.

24 Claims, 7 Drawing Sheets

LOCK AND SHOCK MOUNTED DEVICE FOR COMPUTER DISK DRIVE

BACKGROUND OF THE INVENTION

The present invention is directed to a mounting system for a delicate shock mounted device. The invention has particular utility for mounting a computer data storage system, and more particularly for mounting a disk drive mechanism in a computer circuit board card cage and will be described in connection with such utility although other utility is contemplated.

The installation of a disk drive mechanism in place of standard memory boards in a computer circuit board card cage provides a convenient and cost effective method of upgrading the storage capacity of a computer. However, a disk drive mechanism has certain relatively stringent shock mounting requirements not found in the case of card cage mounted circuit boards. Shock mounting permits a disk drive mechanism to be isolated during operation from external vibrations and shocks which are apt to be present in any building housing a computer. These shock mountings are, of necessity, relatively fragile in order to perform adequate shock isolation, and typically must be immobilized during shipment of the disk drive mechanism. Also, the shock mounting should permit removal or at least partial removal of the disk drive mechanism for maintenance and repair purposes.

SUMMARY OF THE INVENTION

The present invention provides a mounting system for mounting a disk drive in the circuit board card cage of a computer. More particularly, the invention provides a shock isolation mounting device for slide mounting a disk drive mechanism in the card guide support of a computer chassis, and comprising a clamp assembly for clamping the disk drive mechanism in a first inoperative position, and a cam assembly which is displaceable with respect to the clamp assembly for moving the clamp assembly to a second operative position. There is also provided a control mechanism for selectively holding the cam assembly in its operative position and a control mechanism for controlling release of the clamp assembly so that the cam assembly can move to its inoperative position. In the inoperative position the cam assembly releases the clamp assembly so that the disk drive is free to be supported only by its shock mount.

DETAILED DESCRIPTION OF THE INVENTION

In order to understand the invention reference should be made to the following detailed description taken in connection with the accompanying drawings wherein.

Figure 1:
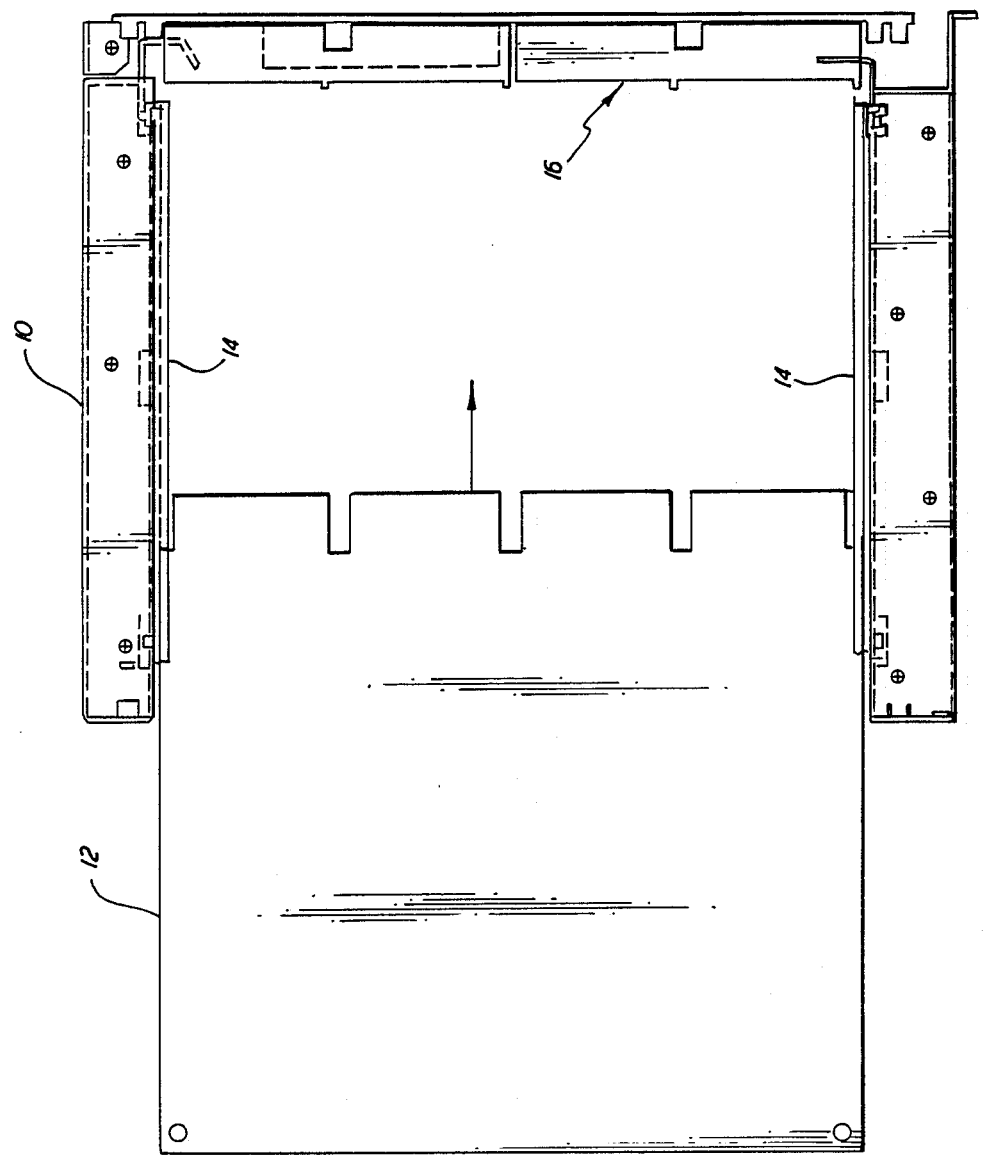
FIG. 1 is a partially schematic diagrammatic drawing of a prior art system showing a typical card cage guide or support associated with a computer chassis and showing a printed circuit board being slid into position on the chassis.
Figure 2:
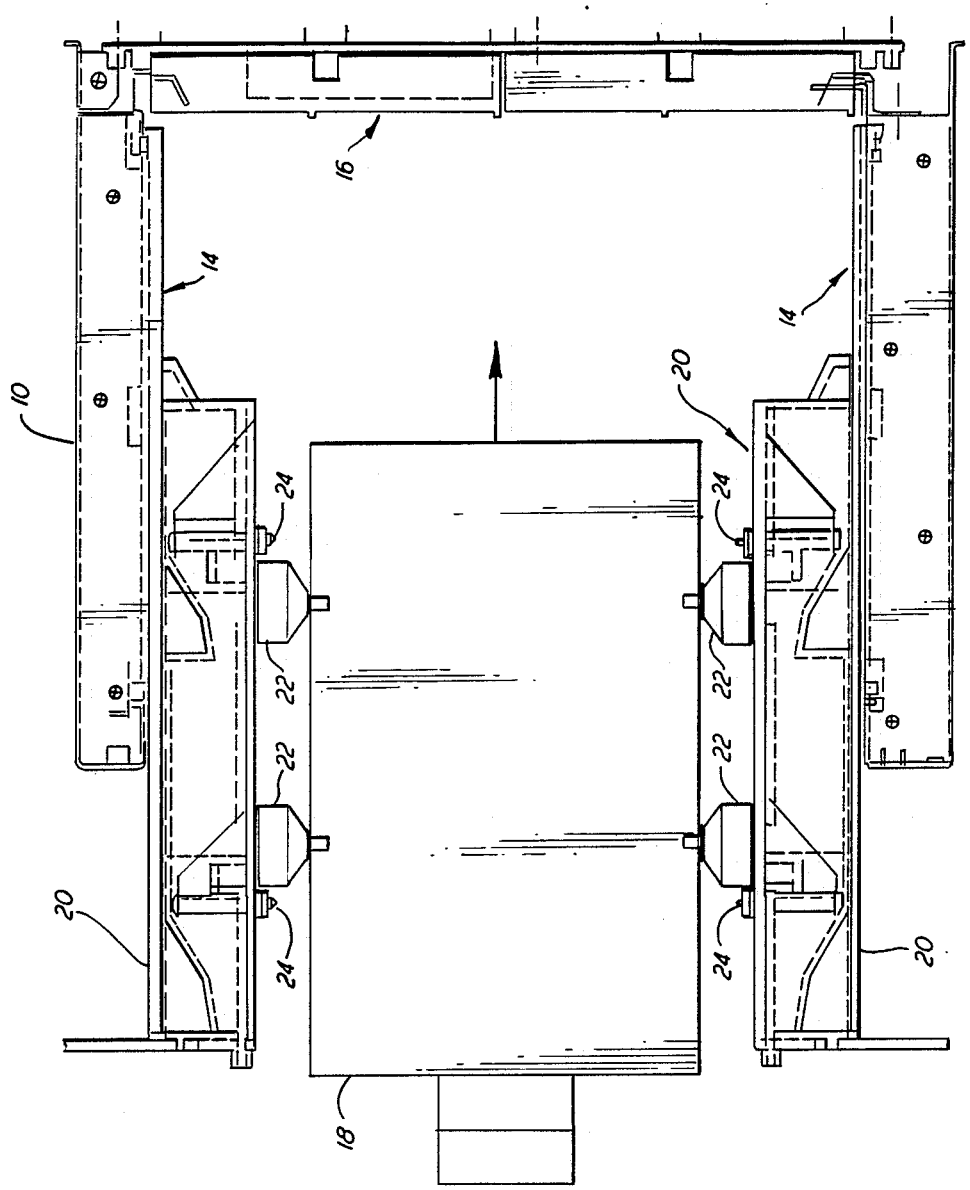
FIG. 2 is a view similar to FIG. 1 showing a disk drive its associated support being substituted for the printed circuit board f FIG. 1, and being slid into position on the chassis in accordance with the present invention.

Referring now to FIGS. 1 and 2, FIG. 1 shows a card case 10 of a computer which is arranged to receive a number of circuit boards 12 for providing data storage. The circuit boards 12 are slide mounted on opposed card guides 14, and are electrically connected to the computer through back plane connectors 16. In those instances where the data storage capacity of the computer is to be upgraded, it is desired to replace the circuit boards 12 by a disk drive 18 shown in FIG. 2. In this case, the disk drive 18 is carried within opposed supports 20 which are slide mounted in card guides 14, and the disk drive is mounted to supports 20 by a plurality of shock mounts 22, there preferably being two mounts at the top and two mounts at the bottom. A plurality of locking pins 24 (shown in their retracted position) are provided for selectively holding drive 18 in an inoperative position when they engage in appropriate openings in the top and bottom of the disk drive as will be described in detail hereinafter.

Figure 3:
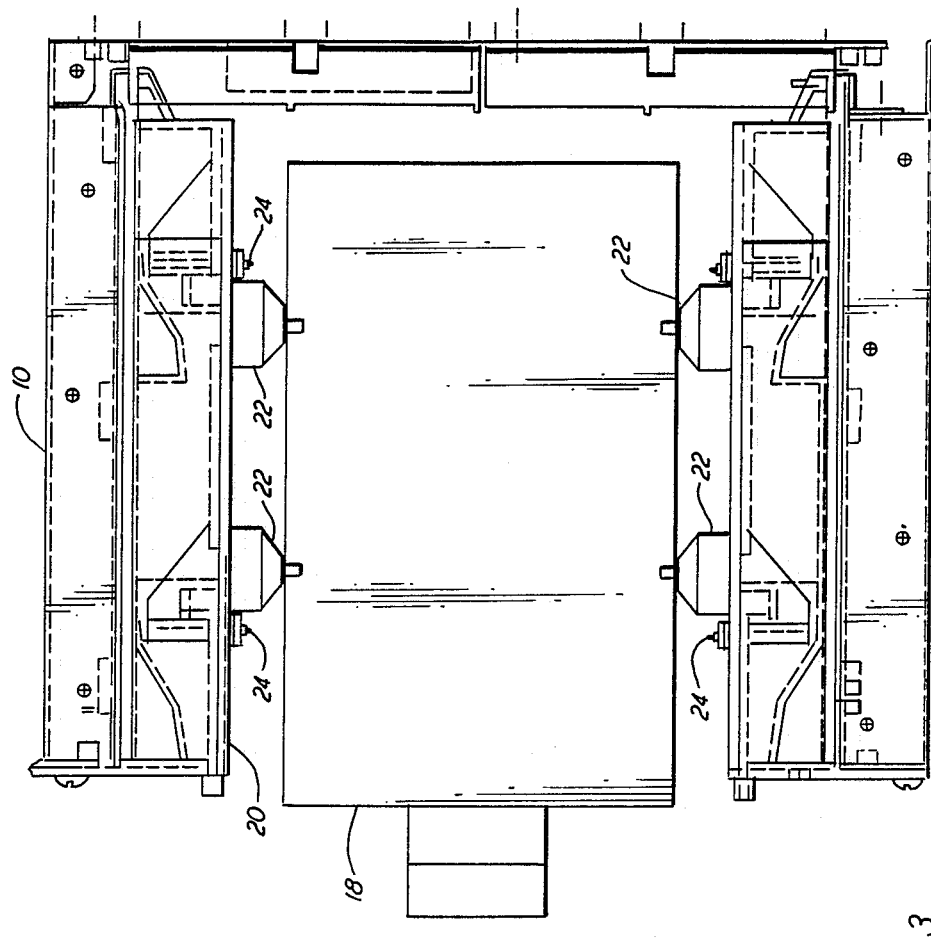
FIG. 3 is a similar to FIG. 2 showing the disk drive mounted in its working position with the disk drive being supported only by the shock mounts in accordance with the present invention.
Figure 4:
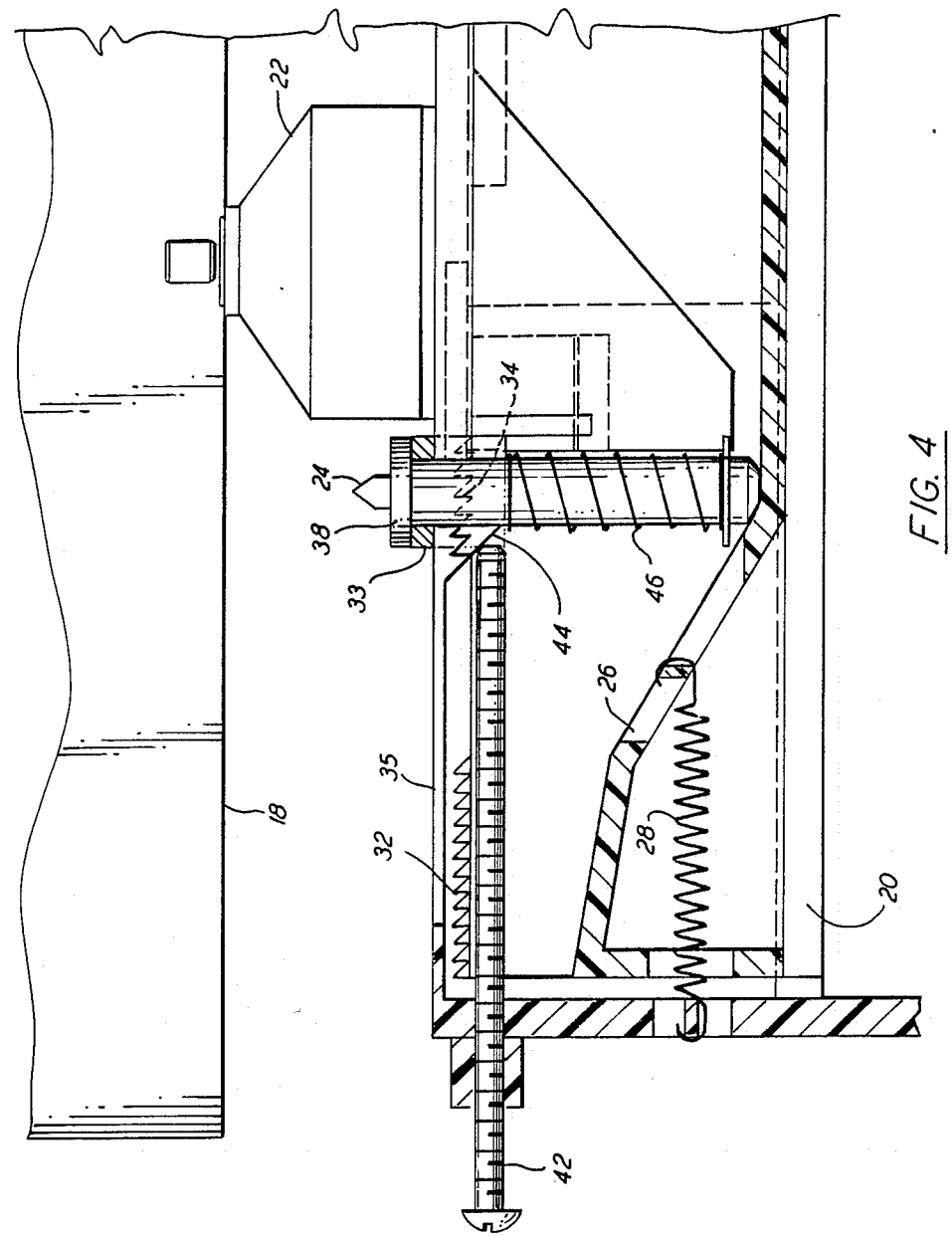
FIG. 4 is an enlarged partially sectional view showing details of one of the shock mounts and an associated clamp and cam assembly in accordance with the present invention.
Figure 5:
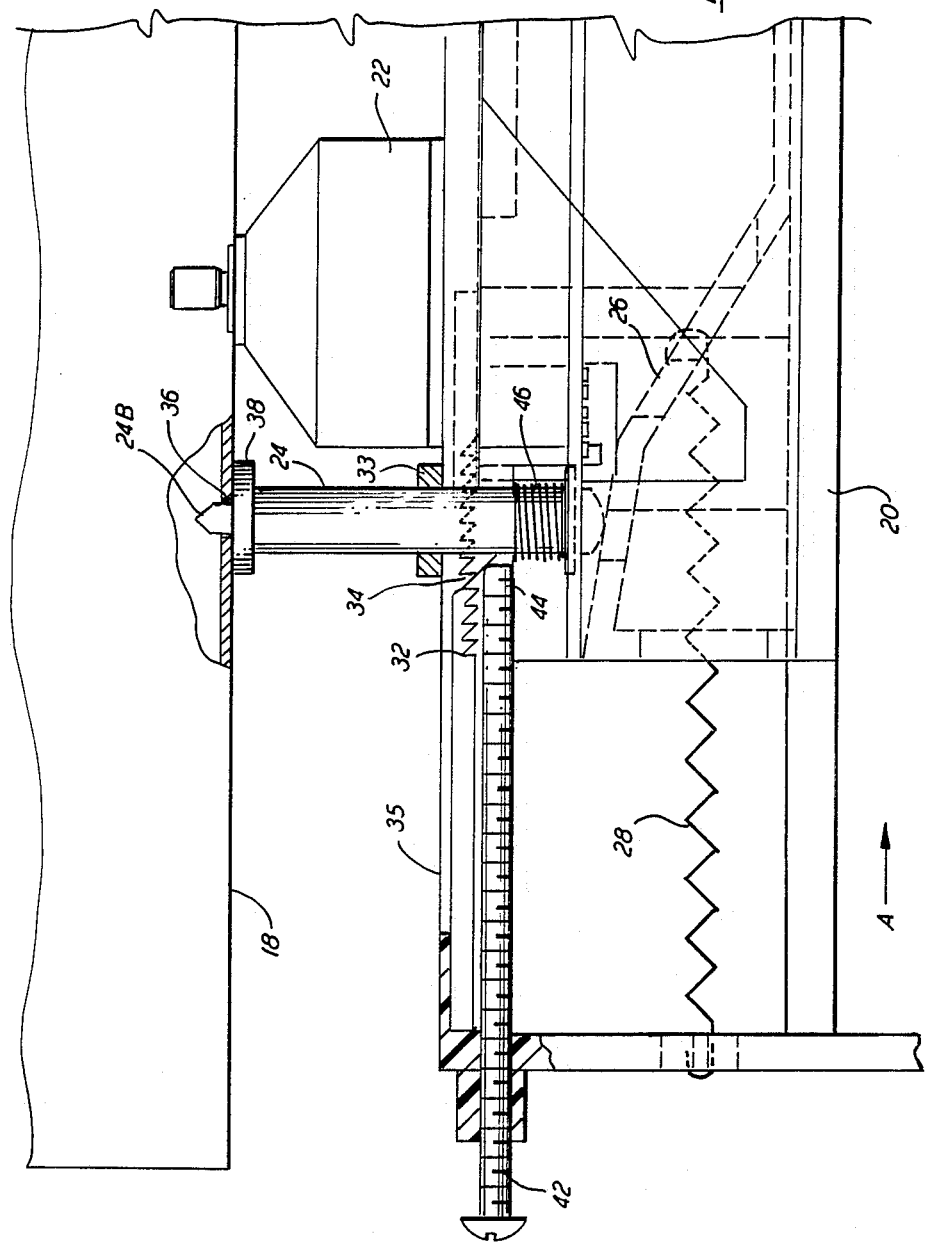
FIG. 5 is a view similar to FIG. 4 with the cam assembly moved to its operative position with the associated clamp assembly in clamping position with respect to the disk drive.

FIG. 3 shows the support 20 and disk drive 18 moved to the operative position for controlling transfer of data to and from the disk drive and the associated computer. Referring now to FIG. 4 there is shown an enlarged detailed, partially sectional, view of a portion of the control mechanism for controlling the locking pins 24. The control mechanism comprises the laterally displaceable cam 26 which is normally held in the position shown in FIG. 4 by means of a spring 28. The cam 26 is arranged to bear on the bottom of locking pin 24 so that when the cam is moved to the rights as shown in FIG. 5, i.e. in the direction of Arrow A, the pin will be moved up (within support 33) into engagement with the disk drive 18. For holding cam 26 in its operative position, there is provided a locking mechanism comprising teeth 32 associated, and movable with, cam 26 and arranged to engage ratchet teeth 34 which are carried by the support 20 by means of a cantilever arm 34.

Figure 6:
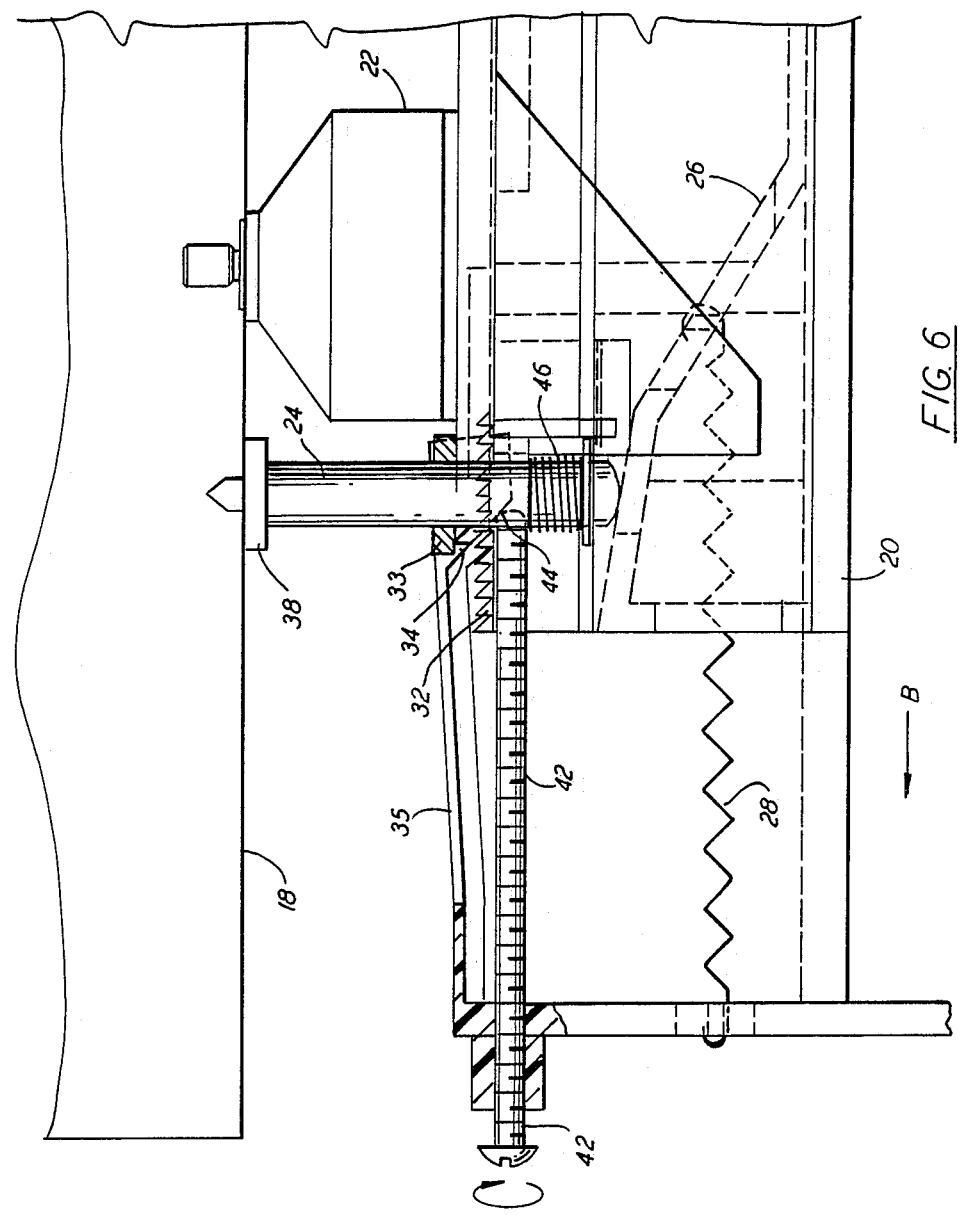
FIG. 6 is a view similar to FIG. 5 showing the operation of control mechanism for unlocking the cam assembly so it is free to move to its inoperative position.
Figure 7:
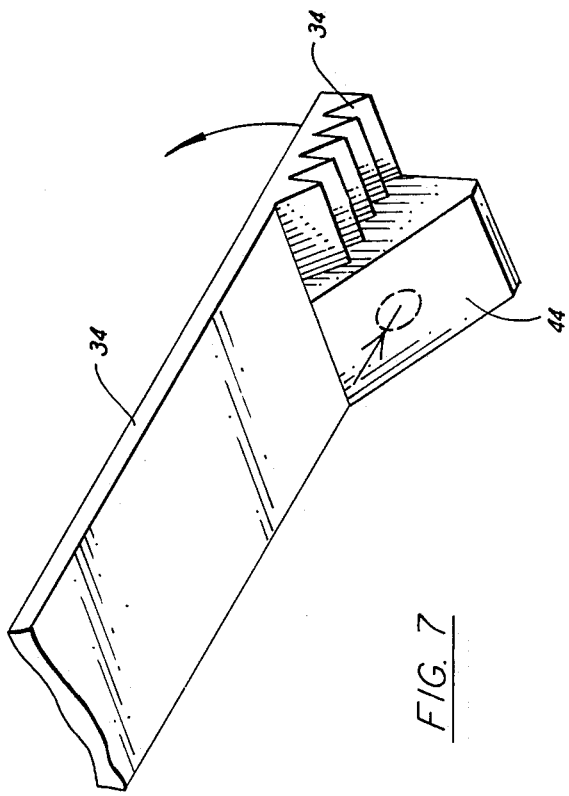
FIG. 7 is a detailed partially schematic view of a portion of cam assembly control mechanism.

In FIG. 5 cam 26 has been moved fully to the right and the locking pin 24 has been pushed upwardly so that the upper end 24B thereof has passed through a suitable hole 36 in the bottom of the disk drive and the flange 38 associated with the locking pin 24 is in engagement with the bottom of disk drive 18. In operation of the device, cam 26 can be pushed to the right by inserting a blunt tool, such as a Philips head screwdriver, through a hole (not shown) in the left hand wall of the support 20. The end of the screwdriver can then be pushed against cam 26 to move it from its inoperative position to its operative position where it becomes latched by the cooperation of the teeth 32 and 34. With the teeth engaged, the cam 26 is firmly held in its operative position and the locking pins 24 firmly lock disk drive 18 in position. Generally, but not necessarily it is preferred to lock the bottom pins before locking the top pins. When the computer is in its final operative position and, will not be subjected to the shock of moving, the locking pins 24 may then be withdrawn from contact with the disk drive 18 so that the disk drive 18 is free to be supported only by the shock mountings 22. Referring in particular to FIGS. 5 and 6, a screw mechanism 42 is provided for selectively engaging a cam surface 44 to force ratchet teeth 34 up and away from the cam teeth 32 so that cam 22 is free to move to the left as seen in FIG. 6, i.e. in the direction of Arrow B under the influence of the spring 28. As the cam 26 moves to the left a spring 46 forces pin 24 in a downward direction following the cam surface and the pin is disengaged from hole 36 thereby freeing the disk drive 18 for support only by the shock mount 22.

While a preferred embodiment invention has been described above numerous modifications may be provided without departing from the spirit of the invention. For example, rather than having many teeth on the two cooperating members for holding the cam, a single tooth on each member can be provided. A multiplicity of teeth, however, gives a range of adjustability for location of the lateral cam. Additionally, the teeth can be moved laterally with respect to each other rather than vertically as illustrated. The pins for locking the shock mounted device can move from the sides of the device rather than from top and bottom as illustrated. Similarly, the cam assembly can be replaced by a mechanical linkage which, when moved beyond its center line between two pivot points, stays locked. Such a system could then be unlocked by movement back across the center line.

The mounting system locking device of the present invention also can be used for shipment of the disk drive in its support, separate from a computer system which is to use the device. This embodiment, for example, may be employed when it is desired to upgrade the data storage capacity of an installed computer.

In yet another embodiment of the invention, the cam assembly, rather than being a linearly movable cam, may comprise a cam wheel rotatably movable around its axis from an inoperative position to an operative position. In such embodiment the cam assembly can be held in operative position by a constant radius portion of a cam or a portion which is decreased from a maximum radius. A similar type of cam shape can be used in a linear cam, i.e. by providing a cam with a high point and a slightly lower point which would thus tend to hold the cam in its operative position.

What is claimed is:

1. A mounting system for a delicate shock-mounted device, comprising a support for the device, a locking assembly associated with the support and movable towards said device to lock said device against movement with respect to the support, a cam assembly laterally displaceable with respect to said locking assembly from a first inoperative position to a second operative position where the cam assembly activates said locking assembly, and a control mechanism for selectively holding said cam assembly in its operative or its inoperative position.

2. A mounting system for a delicate shock-mounted device, comprising a support for the device, a shock mount between the device and the support, a clamping assembly associated with the support and movable towards said device to lock said device against movement with respect to the support, a cam assembly movable with respect to the device support, and a locking and control assembly for selectively holding said cam assembly in its operative or its inoperative position.

3. The mounting system of claim 2 wherein said control assembly comprises a control member operable from outside said support to bear on a cam surface on the cam assembly whereby to move ratchet teeth thereon in or out of engagement with cooperating ratchet teeth on the cam.

4. The mounting system of claim 2, and including a plurality of pins moveably mounted on said support for engagement with appropriate recesses associated with the device.

5. The mounting system of claim 2 wherein said cam assembly comprises a linear cam.

6. The mounting system of claim 5 wherein said ratchet surface is located on a portion of said linear cam.

7. The mounting system of claim 6 wherein said cooperating ratchet teeth are located on said cam locking and control assembly.

8. The mounting system of claim 7 wherein said control assembly is arranged to bear on a surface on said cam assembly.

9. The mounting system of claim 3 and including a screw assembly operable from outside said support to bear on the cam surface on the cam assembly whereby to move ratchet teeth thereon out of engagement with cooperating ratchet teeth on the linear cam.

10. The mounting system of claim 4 and including a spring associated with each pin for urging its associated pin to a retracted position when the linear cam is moved to its inoperative position.

11. A mounting system for a delicate shock-mounted device, comprising a support for the device, a locking assembly associated with the support and movable towards said device to lock said device against movement with respect to the support, a linear cam assembly located within said support for activating said locking assembly, and a locking and control assembly for selectively holding said cam in a first operative position and a second inoperative position.

12. The mounting system of claim 11, wherein said linear cam is arranged to be released by force applied outside of the support.

13. A mounting system for mounting a disk drive mechanism in a computer circuit board card cage, and comprising, in combination a support for the device, a locking assembly associated with the support and movable towards said device to lock said device against movement with respect to the support, a cam assembly laterally displaceable with respect to said locking assembly from a first inoperative position to a second operative position where the cam assembly activates said locking assembly, and a control mechanism for selectively holding said cam assembly in its operative or its inoperative position.

14. A mounting system for mounting a disk drive mechanism in a computer circuit board card cage, and comprising, in combination a support for the device, a shock mount between the device and the support, a clamping assembly associated with the support and movable towards said device to lock said device against movement with respect to the support, a cam assembly movable with respect to the device support, and a locking and control assembly for selectively holding said cam assembly in its operative or its inoperative position.

15. The mounting system of claim 14 wherein said control assembly comprises a control member operable from outside said support to bear on a cam surface on the cam assembly whereby to move ratchet teeth thereoin in or out of engagement with cooperating ratchet teeth on the cam.

16. The mounting system of claim 14, and including a plurality of pins moveably mounted on said support for engagement with appropriate recesses associated with the device.

17. The mounting system of claim 14 wherein said cam assembly comprises a linear cam.

18. The mounting system of claim 17 wherein said ratchet surface is located on a portion of said linear cam.

19. The mounting system of claim 18 wherein said cooperating ratchet teeth are located on said cam locking and control assembly.

20. The mounting system of claim 19 wherein said control assembly is arranged to bear on a surface on said cam assembly.

21. The mounting system of claim 15 and including a screw assembly operable from outside said support to bear on the cam surface on the cam assembly whereby to move ratchet teeth thereon out of engagement with cooperating ratchet teeth on the linear cam.

22. The mounting system of claim 16 and including a spring associated with each pin for urging its associated pin to a retracted position when the linear cam is moved to its inoperative position.

23. A mounting system for mounting a disk drive mechanism in a computer circuit board card cage, and comprising, in combination a support for the device, a locking assembly associated with the support, and movable towards said device to lock said device against movement with respect to the support, a linear cam assembly located within said support for activating said locking assembly, and a locking and control assembly for selectively holding said cam in a first operative position and a second inoperative position.

24. The mounting system of claim 23, wherein said linear cam is arranged to be released by force applied outside of the support.

* * * * *